United States Patent
Zundel et al.

(10) Patent No.: US 10,672,661 B2
(45) Date of Patent: Jun. 2, 2020

(54) PRELIMINARY TRENCHES FORMED IN KERF REGIONS FOR DIE SINGULATION

(71) Applicant: Infineon Technologies AG, Neubiberg (DE)

(72) Inventors: Markus Zundel, Egmating (DE); Stefan Mieslinger, Kottgeisering (DE); Thomas Ostermann, Koestenburg (AT); Christian Westermeier, Munich (DE); Jochen Hilsenbeck, Villach (AT); Jens Peter Konrath, Villach (AT); Boris Mayerhofer, Neubiberg (DE); Anatoly Sotnikov, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/176,403

(22) Filed: Oct. 31, 2018

(65) Prior Publication Data
US 2020/0135564 A1    Apr. 30, 2020

(51) Int. Cl.
*H01L 21/78* (2006.01)
*H01L 29/16* (2006.01)
(Continued)

(52) U.S. Cl.
CPC ............ *H01L 21/78* (2013.01); *H01L 21/049* (2013.01); *H01L 21/0475* (2013.01); *H01L 21/0485* (2013.01); *H01L 29/1608* (2013.01); *H01L 29/0696* (2013.01); *H01L 29/407* (2013.01); *H01L 29/6606* (2013.01); *H01L 29/66075* (2013.01)

(58) Field of Classification Search
None
See application file for complete search history.

(56) References Cited

U.S. PATENT DOCUMENTS

| | | |
|---|---|---|
| 8,896,047 B2 | 11/2014 | Wood et al. |
| 9,871,119 B2 | 1/2018 | Wood et al. |

(Continued)

OTHER PUBLICATIONS

Zechmann, Arno et al., "Semiconductor Wafer Dicing Crack Prevention Using Chip Peripheral Trenches", U.S. Appl. No. 15/444,386, filed Feb. 28, 2017, 1-46.

*Primary Examiner* — Asok K Sarkar
(74) *Attorney, Agent, or Firm* — Murphy, Bilak & Homiller, PLLC

(57) ABSTRACT

A semiconductor wafer having a main surface and a rear surface opposite from the main surface is provided. A die singulation preparation step is performed in kerf regions of the semiconductor wafer. The kerf regions enclose a plurality of die sites. The die singulation preparation step includes forming one or more preliminary kerf trenches between at least two immediately adjacent die sites. The method further includes forming active semiconductor devices in the die sites, and singulating the semiconductor wafer in the kerf regions thereby providing a plurality of discrete semiconductor dies from the die sites. The one or more preliminary kerf trenches are unfilled during the singulating, and the singulating includes removing semiconductor material from a surface of the semiconductor wafer that is between opposite facing sidewalls of the one or more preliminary kerf trenches.

23 Claims, 12 Drawing Sheets

(51) Int. Cl.
*H01L 21/04* (2006.01)
*H01L 29/66* (2006.01)
*H01L 29/06* (2006.01)
*H01L 29/40* (2006.01)

(56) References Cited

U.S. PATENT DOCUMENTS

| | | | |
|---|---|---|---|
| 2006/0292830 A1* | 12/2006 | Daubenspeck | H01L 21/78 438/460 |
| 2009/0186465 A1* | 7/2009 | Fujisawa | H01L 21/78 438/462 |
| 2011/0204488 A1 | 8/2011 | Itou et al. | |
| 2013/0200392 A1* | 8/2013 | Schmidt | H01L 29/66068 257/77 |

* cited by examiner

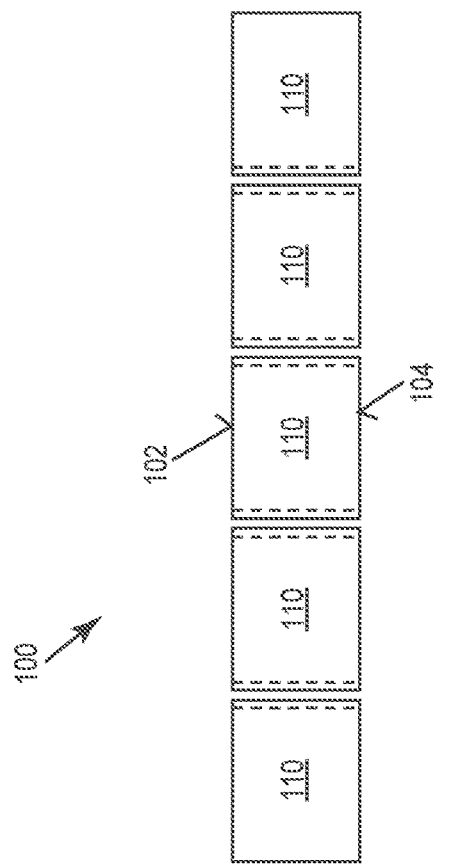
*FIG. 1B*
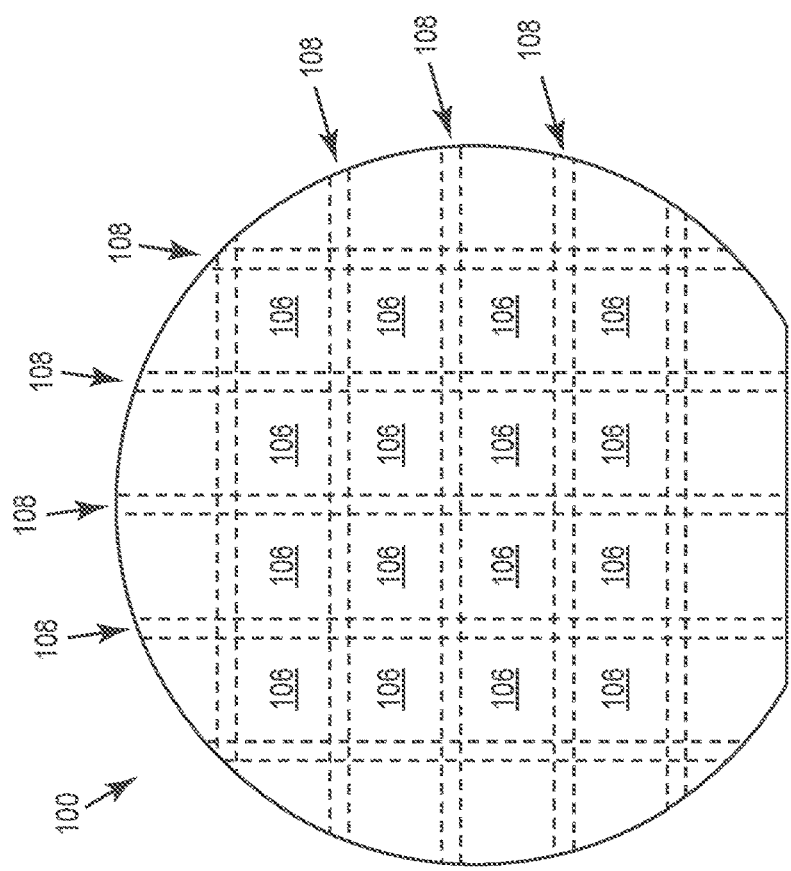
*FIG. 1A*
*FIG. 1*

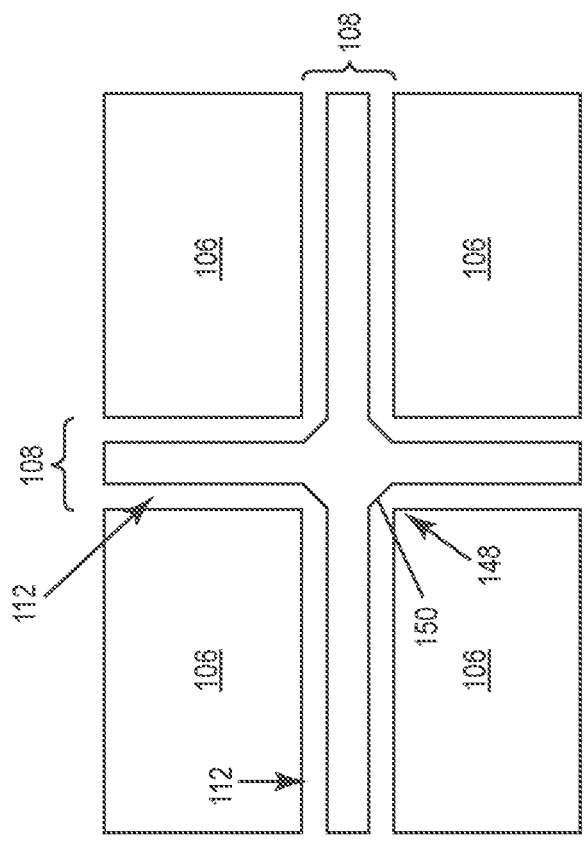
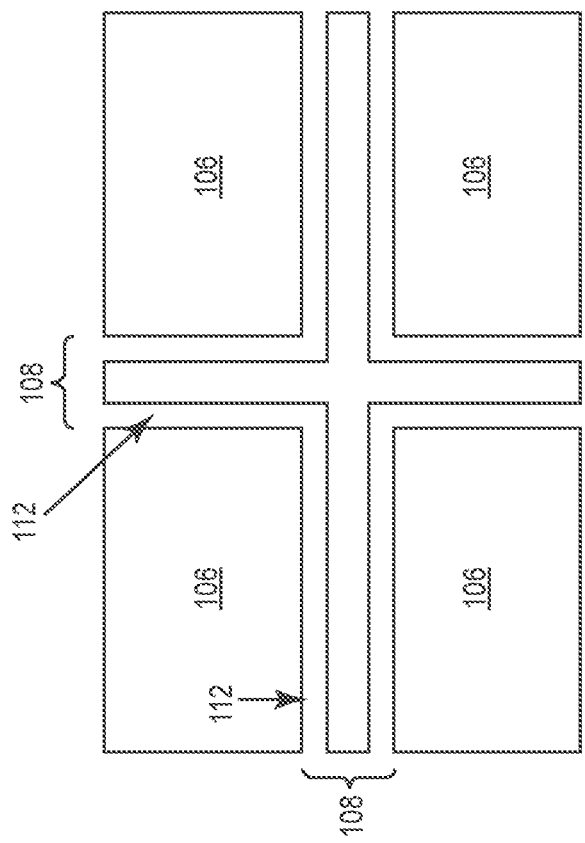
FIG. 7

PRELIMINARY TRENCHES FORMED IN KERF REGIONS FOR DIE SINGULATION

TECHNICAL FIELD

The present application relates to semiconductor device fabrication, and in particular relates to wafer dicing.

BACKGROUND

Die singulation refers to the step or steps used to separate individual die sites from the semiconductor wafer and to form discrete semiconductor dies. A variety of different techniques can be used to cut the semiconductor wafer in a singulation process. Examples of these techniques include mechanical sawing, laser cutting and chemical etching techniques, to name a few. These techniques suffer from various drawbacks including the formation of cracks in the active area of the semiconductor dies and/or the formation of recast material on the main surface of the semiconductor wafer. These drawbacks can detrimentally impact yield and/or performance of the discrete semiconductor dies.

One technique that is used to improve known die singulation processes is the inclusion of a so-called kerf clean processes. This process is used to remove structures, such as test structures and/or lithography alignment features, that are formed in the kerf regions of the semiconductor wafer prior to singulation. This prevents the kerf region structures from interfering with the cutting mechanism (e.g., a saw blade). However, known kerf clean processes add substantial cost to the process, and result in rough surfaces which are susceptible to cracks and/or reduction in die strength.

Silicon Carbide (SiC) technology presents unique challenges with respect to die singulation. Due to the hardness of the SiC material, mechanical sawing techniques commonly cause chipping of the material, resulting in yield losses. Moreover, the hardness of the SiC material causes wear and breakage of saw blades. For this reason, a laser ablation is commonly used to cut SiC or SiC based wafers. One drawback of laser ablation is that, the vapourized semiconductor material can reform on the main surface of the semiconductor dies as recast material, which can lead to yield losses and complete device failure.

SUMMARY

Those skilled in the art will recognize additional features and advantages upon reading the following detailed description, and upon viewing the accompanying drawings.

A method of forming a semiconductor device is disclosed. According to an embodiment, the method includes providing a semiconductor wafer having a main surface and a rear surface opposite from the main surface. A die singulation preparation step is performed in kerf regions of the semiconductor wafer. The kerf regions enclose a plurality of die sites. The die singulation preparation step includes forming one or more preliminary kerf trenches between at least two immediately adjacent die sites in the plurality. The method further includes forming active semiconductor devices in the die sites, and singulating the semiconductor wafer in the kerf regions thereby providing a plurality of discrete semiconductor dies from the die sites. The one or more preliminary kerf trenches are unfilled during the singulating, and the singulating includes removing semiconductor material from a surface of the semiconductor wafer that is between opposite facing sidewalls of the one or more preliminary kerf trenches.

According to another embodiment, the method includes providing a semiconductor wafer having a main surface and a rear surface opposite from the main surface. Cell field trenches and preliminary kerf trenches are formed in the main surface of the semiconductor wafer by a common etching step. The preliminary kerf trenches are formed in a grid pattern that encloses a plurality of die sites. The cell field trenches are formed within the die sites. The plurality of die sites are singulated from the semiconductor wafer into a plurality of discrete semiconductor dies. The singulating includes forming a cut between bottom surfaces of the preliminary kerf trenches and the rear surface.

According to another embodiment, the method includes providing a silicon carbide containing wafer having a main surface and a rear surface opposite from the main surface. A grid pattern of preliminary kerf trenches is formed in the main surface of the silicon carbide containing wafer. The grid pattern encloses a plurality of die sites. Laser ablation is performed on an upper surface of the silicon carbide containing wafer that is between opposite facing sidewalls of the preliminary kerf trenches. Performing the laser ablation causes recast material to form substantially along the opposite facing sidewalls. The main surface of the semiconductor wafer in the active die sites is substantially devoid of the recast material after performing the laser ablation.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, depicts a technique for singulating a semiconductor wafer according to an embodiment. FIG. 1A depicts a plan-view of the semiconductor wafer prior to singulation. FIG. 1B depicts a cross-sectional-view of the semiconductor wafer after singulation.

FIG. 7, which includes FIGS. 7A and 7B, depicts different layouts of the preliminary kerf trenches. FIG. 7A depicts a layout with substantially perpendicular intersections between sidewalls of the preliminary kerf trenches, according to an embodiment. FIG. 7B depicts a layout with bevelled transitions between intersecting sidewalls of the preliminary kerf trenches, according to an embodiment.

DETAILED DESCRIPTION

Figure 2:
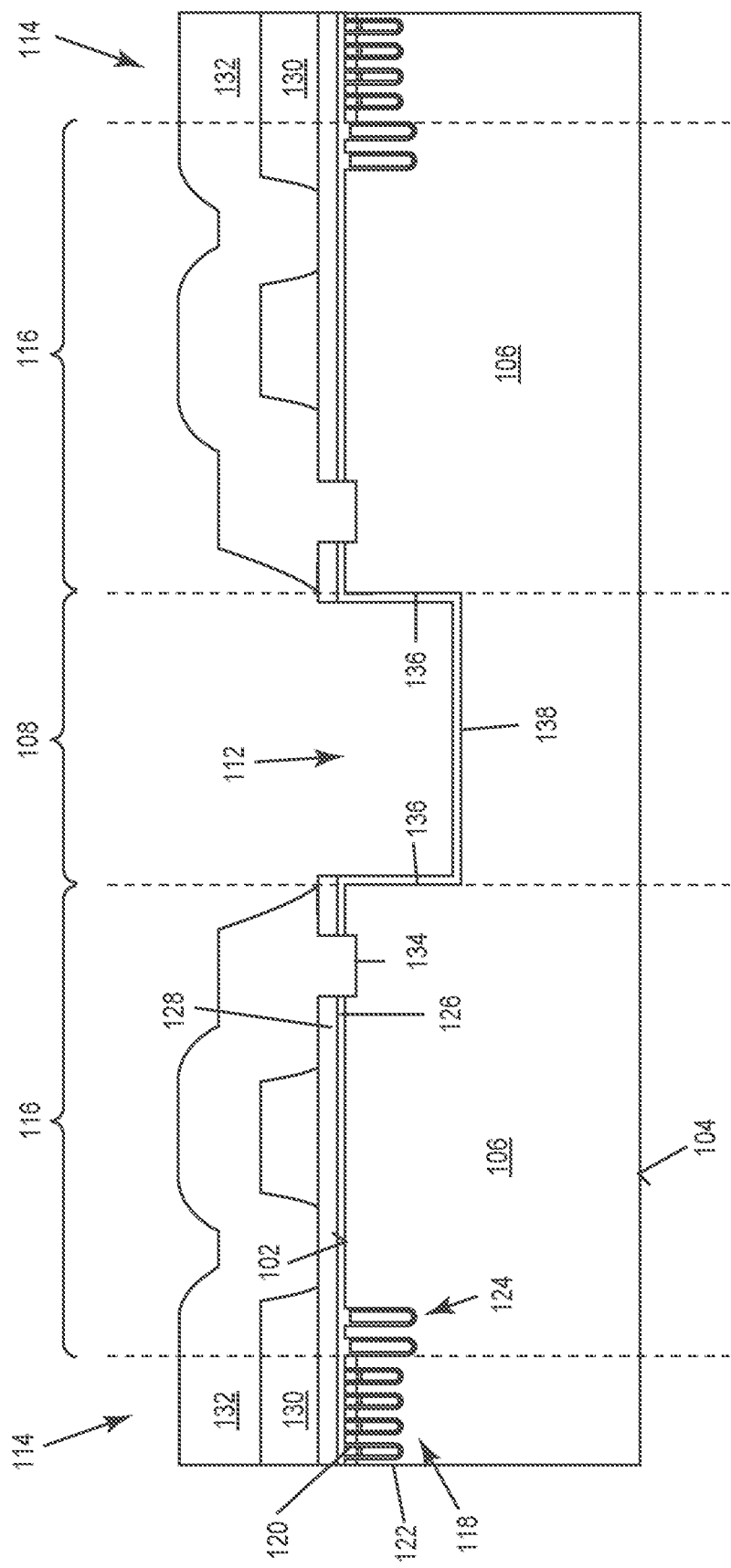
FIG. 2 depicts a method of forming a preliminary kerf trench in the kerf region of a semiconductor wafer prior to singulation, according to an embodiment.

According to embodiments described herein preliminary kerf trenches are formed in kerf regions of a semiconductor wafer prior to singulation. The semiconductor wafer is cut at a location that is within one of the preliminary kerf trenches or between adjacent ones of the preliminary kerf trenches. In either case, the preliminary kerf trenches represent a cost effective technique for singulating semiconductor dies with improved yield and reliability in the final products. Benefits of the technique include smother edge sides in the singulated semiconductor dies, reduced likelihood of cracking from the singulation, and prevention of recast material from accumulating on the surface of the singulated semiconductor dies. Moreover, the formation of the preliminary kerf trenches eliminates the need for a kerf clean process, thereby reducing cost and improving the speed of the singulation process.

Referring to FIG. 1, a general overview of a technique for singulating a semiconductor wafer 100 is illustrated. The semiconductor wafer 100 includes a main surface 102 and a rear surface 104 opposite from the main surface 102. The main and rear surfaces 102, 104 can be substantially planar surfaces. The semiconductor wafer 100 can include any crystalline semiconductor material that is suitable for manufacturing of semiconductor devices. Exemplary materials for the semiconductor wafer 100 include silicon (Si), group IV compound semiconductor materials such as silicon carbide (SiC) or silicon germanium (SiGe). Alternatively, the semiconductor wafer 100 can include a type 111-V semiconductor including gallium nitride, gallium arsenide (GaAs), aluminium nitride (AlN), aluminium arsenide (AlAs), indium nitride (InN), indium arsenide (InAs), etc. The semiconductor wafer 100 can be provided from a commercially bulk semiconductor wafer. According to an embodiment, the semiconductor wafer 100 includes a base substrate (e.g., a bulk silicon wafer) which provides the rear surface 104 and one or more epitaxial layers formed on the base substrate, the uppermost of which extends to the main surface 102.

As shown in FIG. 1A, the semiconductor wafer 100 includes a plurality (i.e., two or more) of die sites 106. The die sites 106 are locations on the semiconductor wafer 100 that contain active semiconductor devices, e.g., transistors, diodes, thyristors, etc. The die sites 106 are bounded by kerf regions 108, which enclose the die sites 106. As shown, the kerf regions 108 form a grid pattern with intersecting kerf regions 108 that may be perpendicular to one another. The kerf regions 108 are inactive regions that do not include active semiconductor devices. Various temporary structures may be formed in the kerf regions 108 before singulation. Examples of these temporary structures include test structures for testing technology specific parameters of the wafer (e.g., process control monitoring (PCM) structure) and/or mask alignment features.

As shown in FIG. 1B, the semiconductor wafer 100 is singulated (i.e., cut) in the kerf regions 108. As a result, the die sites 106 of the semiconductor wafer 100 are separated into a plurality of discrete semiconductor dies 110. Various techniques for performing this singulation process will be described in further detail below. Each discrete semiconductor die provides a fully functional integrated circuit. Examples of these devices include power transistors, amplifier devices, processors, controllers, etc.

Referring to FIG. 2, a cross-sectional view of a semiconductor wafer 100 is shown, according to an embodiment. In this example, the semiconductor wafer 100 has been processed prior to singulation to form a preliminary kerf trench 112 in the kerf region 108, according to an embodiment. The cross-sectional view is taken between two of the die sites 106 and one of the kerf regions 108 as described with reference to FIG. 1. In this embodiment, each die site 106 includes an active device region 114 and a termination region 116. The active device region 114 includes active semiconductor devices that directly contribute to the logical functionality of the completed semiconductor die. By contrast, the termination region 116 includes structures that do not directly contribute to the logical functionality of the completed semiconductor die. The termination region 116 is disposed between the active device region 114 and the kerf region 108. Thus, the termination region 116 separates the active device region from the outer chip edges of the singulated semiconductor dies. In an embodiment, the termination region 116 forms an enclosed loop that borders the kerf regions 108 and the active device region 114 in all directions.

In the depicted embodiment, the active device region 114 includes one or more vertical transistor devices. These vertical transistor devices are provided from a plurality of trenched electrode structures 118 that are formed between doped semiconductor regions 120 (e.g., n-type or p-type regions). The trenched electrode structures 118 include cell field trenches 122 which extend from the main surface 102 into the semiconductor body. A conductive electrode and a trench dielectric are formed in each cell field trench. The conductive electrode can be formed from an electrically conductive material, e.g., polysilicon or a conductive metal. The trench dielectric can be formed from an electrical insulator, e.g., silicon dioxide ($SiO_2$), silicon nitride (SiN), silicon oxynitride ($SiO_xN_y$), etc. The doped semiconductor regions 120 provide the active regions of the semiconductor device, e.g., drain regions, body regions, source regions, emitter regions, collector regions, etc. The trenched electrode structures 118 can be configured as gate structures that control a conduction state of a current flowing between the doped semiconductor regions 120. In addition or in the alternative, the trenched electrode structures 118 can be configured as field electrode structures that provide compensatory charges for adjacent semiconductor regions (e.g., drift regions) within the semiconductor body.

More generally, the active device region 114 can include a wide variety of active semiconductor devices such as transistors, diodes, thyristors, etc. These active devices can be so-called vertical devices that are configured to conduct in a vertical direction of the semiconductor wafer 100 between the main and rear surfaces 102, 104 or so-called lateral devices that are configured to conduct in a lateral direction of the semiconductor wafer 100 that is parallel to the main surface 102.

In the depicted embodiment, the termination region 116 includes a number of field termination trenches 124 that are immediately adjacent to the trenched electrode structures 118 of the active semiconductor devices. These field termination trenches 124 include a conductive electrode and a dielectric material. According to an embodiment, the field termination trenches 124 have a different geometry (i.e., depth and/or width) as the cell field trenches 122. The field termination trenches 124 can be configured to direct equipotential lines away from the chip edge in the singulated semiconductor die. More generally, the termination region 116 can include a variety of different structures that serve a variety of different purposes, e.g., field termination, chipping stopper, mask alignment, etc.

In the depicted embodiment, the semiconductor wafer 100 additionally includes first and second dielectric layers 126, 128 formed on the main surface 102 of the semiconductor wafer 100. Both the first and second dielectric layers 126, 128 can be include electrically insulating material, e.g., silicon dioxide ($SiO_2$), silicon nitride (SiN), silicon oxynitride ($SiO_xN_y$), etc. These first and second dielectric layers 126, 128 can be formed according to known deposition and/or thermal oxidation techniques. As shown, the first dielectric layer 126 can be formed in the field termination trenches 124 so as to provide the dielectric insulation of the trenched electrode structures 118. A first metallization layer 130 of, e.g., copper, is provided on the second dielectric layer 128 and provides device terminals (e.g., gate, source, etc.) for the active semiconductor devices. Finally, an interlayer dielectric layer 132 is formed on the first metallization layer 130 and the second dielectric layer 128. The interlayer dielectric layer 132 can be a relatively thick (e.g., 5-20 µm) layer of electrically insulating material e.g., silicon dioxide ($SiO_2$), imide, etc. A notch 134 can be formed in the termination region 116 wherein the interlayer dielectric layer 132 fills the notch 134. This provides a so-called diffusion stopper structure that prevents potentially damaging ions (e.g., $Na^+$ ions) from reaching the active semiconductor devices.

A preliminary kerf trench 112 is formed in the kerf region 108. The preliminary kerf trench 112 is a recessed structure having opposite facing sidewalls 136 which extend from the main surface 102 towards the rear surface 104. These opposite facing sidewalls 136 can be, but are not necessarily, perpendicular to the main surface 102. A bottom surface 138 of the preliminary kerf trench 112 extends between the opposite facing sidewalls 136. Generally speaking, the dimensions of the preliminary kerf trench 112 can vary. As will be explained in further detail below, the preliminary kerf trench 112 can be formed in a common process as the cell field trenches 122. However, these two trenches can have different dimensions, i.e., depth and/or width. For example, the cell field trenches 122 can have a depth in the range of 2-3 µm whereas the preliminary kerf trench 112 can have a depth in the range of 3-6 µm. Moreover, the cell field trenches 122 can have a width in the range of 0.5-2.5 µm whereas the preliminary kerf trench 112 can have width in the range of 25-100 µm. In one particular embodiment, the preliminary kerf trench 112 has a width of about 75 µm. In the case of a semiconductor wafer 100 having a base substrate and an epitaxial layer extending to the main 102 surface of the semiconductor wafer 100, the depth of the preliminary kerf trench 112 can be correlated to the thickness of epitaxial layer. For example, the preliminary kerf trench 112 can have a depth that is between 50% and 150% of a thickness of the epitaxial layer. In the case of a preliminary kerf trench 112 width a depth that is 100% or more than the thickness of the epitaxial layer, the preliminary kerf trench 112 extends into the subjacent base substrate. The width of the preliminary kerf trench 112 can occupy all or at least substantially all (i.e., at least 50-75%) of the width of the kerf region 108. From a plan view perspective of the semiconductor wafer 100, the preliminary kerf trenches 112 can be formed in the same grid pattern as the kerf regions 108 as shown in FIG. 1 such that each die site 106 is separated from an immediately adjacent die site 106 in all directions by a preliminary kerf trench 112. Alternatively, the preliminary kerf trenches may only be provided in selected kerf regions in the grid pattern.

According to an embodiment, the preliminary kerf trenches 112 and the cell field trenches 122 are formed by a common etching process. This means that the same etchant step which forms the cell field trenches 122 simultaneously forms the preliminary kerf trenches 112. For example, a common hardmask (not shown) can be provided on the main surface 102 and patterned to include openings in the geometry of the preliminary kerf trenches 112 and the cell field trenches 122. Subsequently, the semiconductor wafer 100 is etched (e.g., by reactive ion etching) to remove semiconductor material through these openings. In various etching techniques including reactive ion etching, the preliminary kerf trenches 112 can be formed to be deeper and wider than the cell field trenches 122 according to the values described above by patterning the hardmask such that openings for the preliminary kerf trenches 112 have greater exposed semiconductor area than the openings for the cell field trenches 122. After this etching step, the first dielectric layer 126 can be deposited on the semiconductor body. As a result, the first dielectric layer 126 is formed in the cell field trenches 122 and also lines the sidewalls 136 and bottom surface 138 of the preliminary kerf trenches 112. Advantageously, by using common processing steps, the the preliminary kerf trenches 112 can be formed with the first dielectric layer 126 lining its sidewalls 136 without adding any additional cost or delay to the fabrication process.

More generally, the preliminary kerf trenches 112 can be formed at any point in the fabrication process prior to singulation. That is, the preliminary kerf trenches 112 can be formed before, during or after forming the active semiconductor devices in the active device regions 114. Moreover, the preliminary kerf trenches 112 can be formed by any conventional trench formation technique, e.g., wet chemical etching, dry etching, etc.

Figure 3:
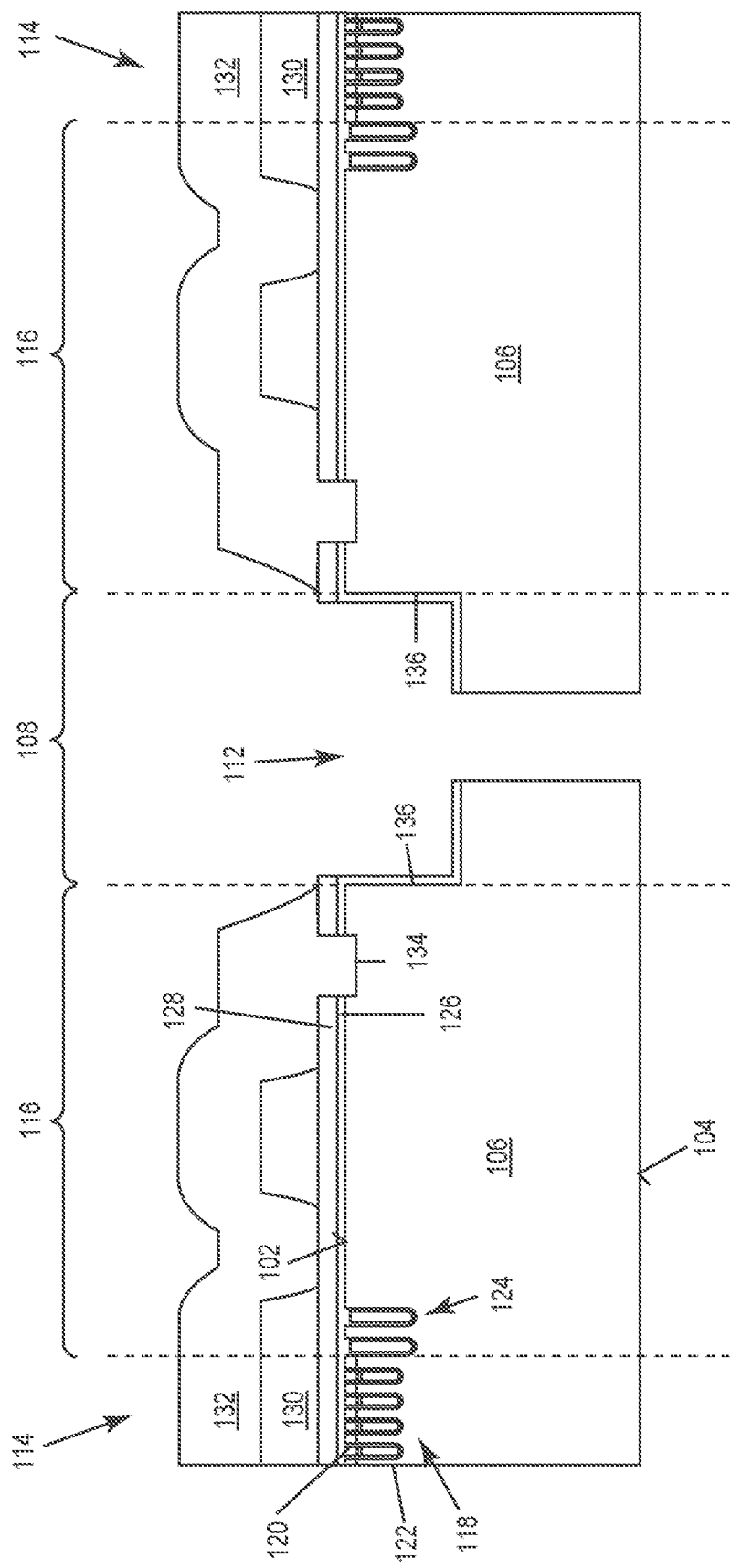
FIG. 3 depicts a method of singulating the semiconductor wafer after forming the preliminary kerf trench, according to an embodiment.

Referring to FIG. 3, a singulation process is performed on the semiconductor wafer 100. According to this process, semiconductor material is removed from a lateral surface of the semiconductor wafer 100 (i.e., a surface that is parallel to the main surface 102) that is within the kerf region 108 and is disposed between opposite facing sidewalls 136 of the preliminary kerf trench 112. This process is performed until the semiconductor wafer 100 is completely separated in the kerf region 108, meaning that each die site 106 is physically detached from the semiconductor wafer 100 so as to provide a plurality of discrete semiconductor dies from the die sites 106. In this example, the cut is formed between the bottom surface 138 and the rear surface 104 of the semiconductor wafer. As a result, an outer edge side for each of the discrete semiconductor dies is provided by the cut surface and one of the sidewalls 136.

The singulation process can be performed using a variety of known techniques for cutting a semiconductor wafer 100. For example, the singulation process can include a mechanical sawing process whereby the semiconductor wafer 100 is physically cut by a saw blade. Alternatively, the singulation process can include a laser cutting process whereby the semiconductor wafer 100 is subjected to a high energy light beam that forms a cut in the semiconductor material. Alternatively, the singulation process can include a plasma etching technique whereby a chemically reactive plasma is used to remove the semiconductor material.

According to an embodiment, the preliminary kerf trenches 112 are unfilled during singulation of the semiconductor wafer 100. This means that during cutting, the preliminary kerf trenches 112 include an open area with ambient atmosphere between the opposing sidewalls 136 and below the main surface 102. The semiconductor surfaces of the preliminary kerf trenches 112 (i.e., the outer sidewalls 136 and the bottom surface 138) can be lined by one or more layers (e.g., the first dielectric layer 126 as shown) and be considered "unfilled" according to the present application. By contrast, a trench that contains any one or combination of dielectric, semiconducting or conductive material that extends least the main surface 102 is considered filled according to the present application.

The above described method of forming preliminary kerf trenches 112 prior to singulation provides several advantages over conventional singulation techniques. The preliminary kerf trenches 112 ensure that there are no structures that interfere with the dicing mechanism (e.g., a saw blade) and can potentially cause cracking during the singulation. Thus, the preliminary kerf trenches 112 eliminate the need for a kerf clean process, which adds delay and cost to the singulation process. Moreover, the preliminary kerf trenches 112 reduce the effective thickness of the wafer to be cut and consequently lessen mechanical strain between adjacent die sites 106 during the singulation process. This reduces the likelihood of chipping. Moreover, because the preliminary kerf trenches 112 extend deeper into the semiconductor body than the cell field trenches 122, the semiconductor material that is sensitive to crystalline defects (i.e., the portion near the main surface 102) is protected from breakage by the first dielectric layer 126 on the sidewalls 136 of the preliminary kerf trenches 112.

Figure 4:
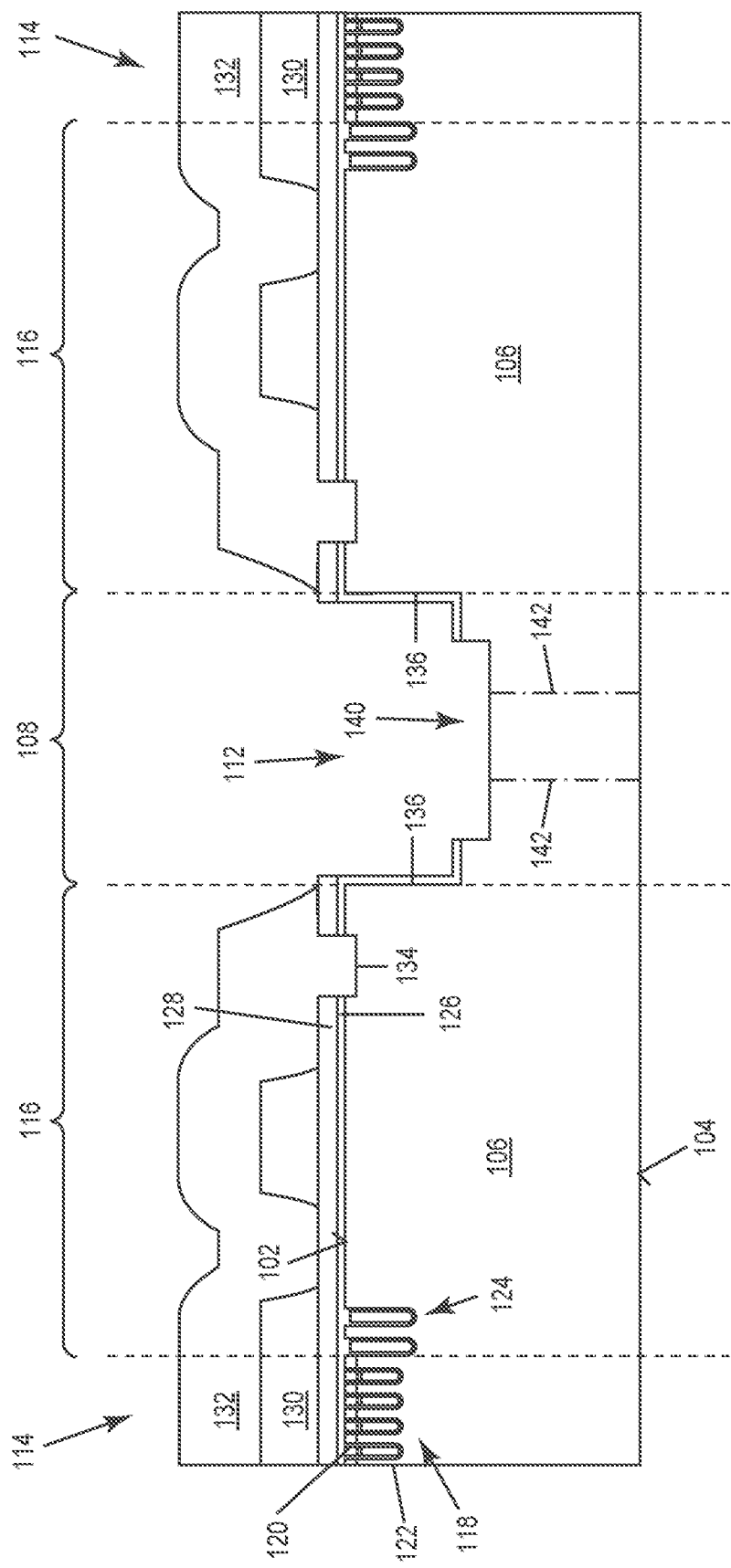
FIG. 4 depicts forming a further trench in the preliminary kerf trench prior to singulation, according to an embodiment.

Referring to FIG. 4, an optional step that can be added to the above described singulation process is shown, according to an embodiment. According to this technique, after forming the preliminary kerf trench 112, a further trench 140 is formed in the bottom of the preliminary kerf trench 112. The further trench 140 is narrower than the preliminary kerf trench 112, meaning that a distance between opposing sidewalls of the further trench 140 is less than the distance between the opposing sidewalls 136 of the preliminary kerf trench 112. Generally speaking, the width of the further trench 140 can be between half of the width of the preliminary kerf trench 112 and substantially all of the width of the preliminary kerf trench 112, e.g., between about 50% and 90% of a width of the preliminary kerf trench 112. The depth of the further trench 140 can vary substantially, e.g., between about 5% and 50% of a thickness of the semiconductor wafer 100 measured from the bottom surface 138 of the preliminary kerf trench 112 to the rear surface 104.

One advantage of this technique of FIG. 4 is a reduction in thickness of the semiconductor material that must be cut, thereby providing further stress relief. Moreover, in the case of a laser cutting process, the sidewalls of the further trench 140 provide a surface which attracts recast material.

The further trench 140 can be formed by performing an additional etching process at any time between the formation of the preliminary kerf trench 112 and the singulation process. Subsequently, the singulation process is performed as described above in the location 142 identified in the figure. As can be seen, the cut is formed within the further trench 140. That is, the cut is formed between the bottom of the further trench 140 and the rear surface 104.

Figure 5:
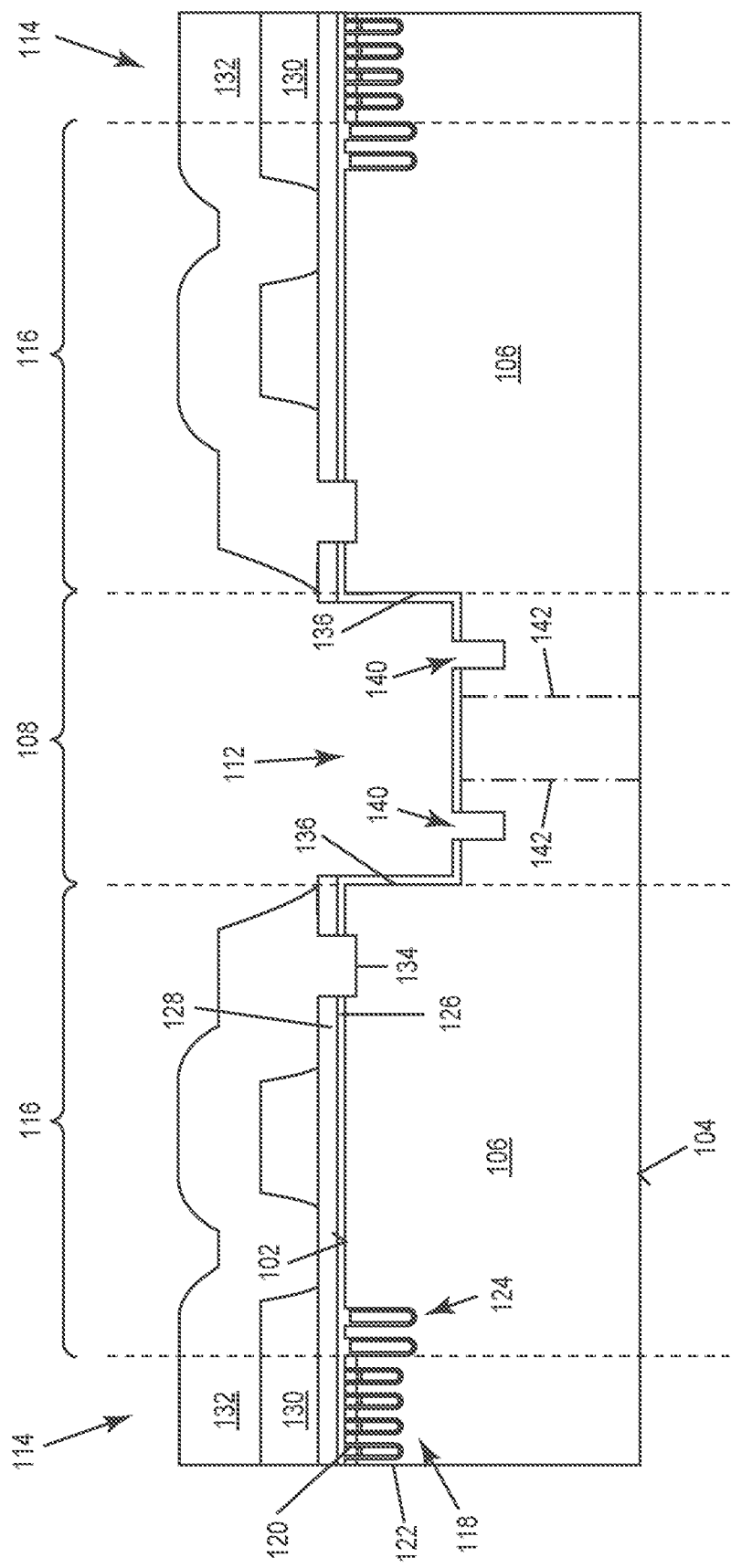
FIG. 5 depicts forming a further trench in the preliminary kerf trench prior to singulation, according to another embodiment.

Referring to FIG. 5, an alternate technique that involves forming the further trenches 140 is depicted, according to an embodiment. According to this, the cut is formed at a location 142 that is outside of the further trench 140. In the depicted embodiment, multiple ones of the further trenches 140 are formed. The further trenches 140 are substantially narrower than the preliminary kerf trench 112, e.g., about 10% of the width of the preliminary kerf trench 112. In the depicted embodiment, two of the further trenches 140 are formed. More generally, any number such as one, three, four, etc. of the further trenches 140 can be formed. The width of these further trenches 140 can vary substantially, between about 50% and 5% of the width of the preliminary kerf trench 112. The depth of these further trenches 140 can vary substantially, e.g., between about 5% and 50% of a thickness of the semiconductor wafer 100 measured from the bottom surface 138 of the preliminary kerf trench 112 to the rear surface 104. One advantage of these further trenches 140 is an additional crack stopping mechanism that prevents caused by the cutting mechanism from reaching the die sites 106.

Figure 6:
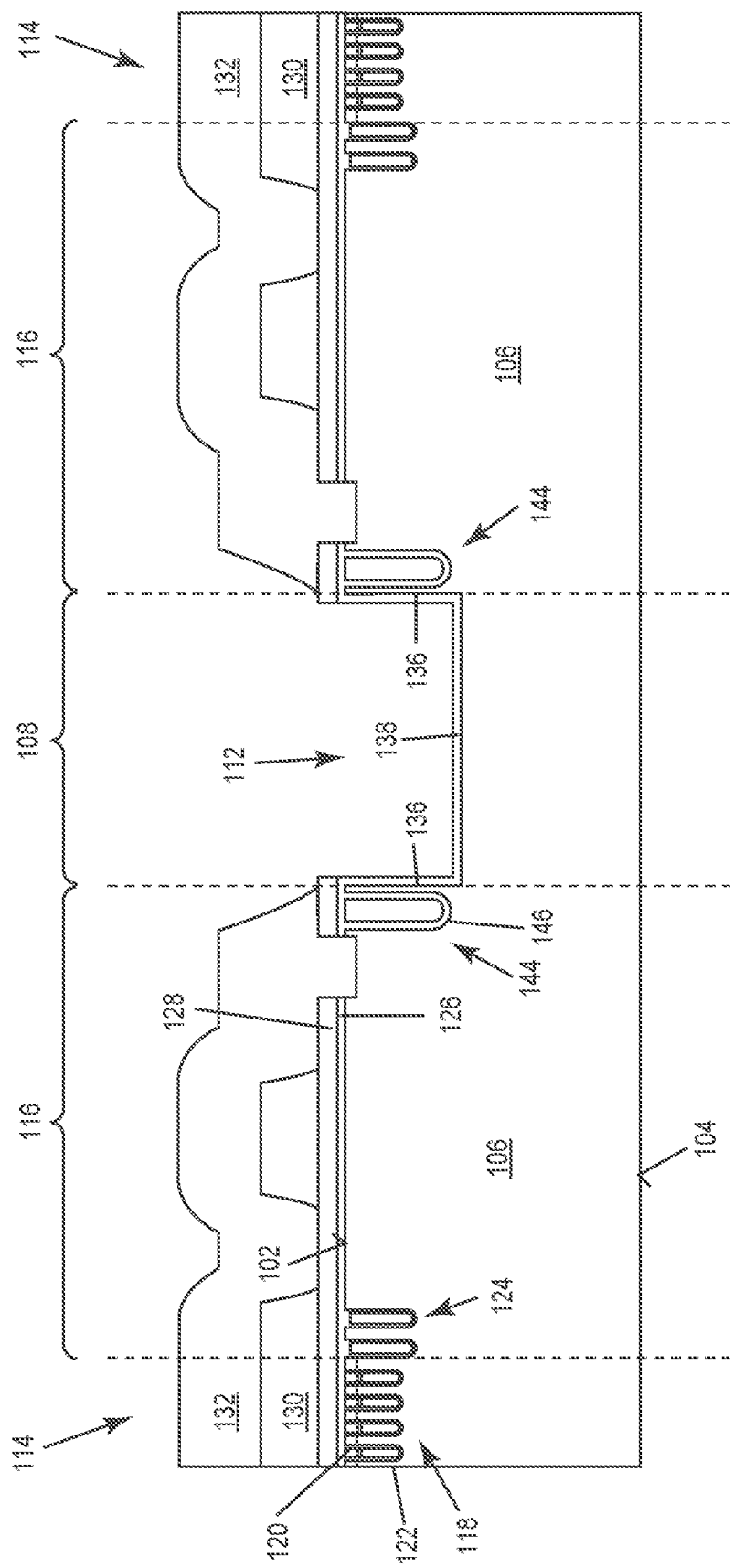
FIG. 6 depicts forming a chip stopping structure adjacent to the preliminary kerf trench prior to singulation, according to an embodiment.

Referring to FIG. 6, an optional step that can be added to any of the above described singulation process variants is shown, according to an embodiment. According to this technique, a chip stopping structure 144 is formed in the termination region 116 prior to singulation. The chip stopping structure 144 is disposed immediately adjacent to one of the sidewalls 136 of the preliminary kerf trench 112. This means that no intentionally formed structures that are necessary for the function or performance of the discrete semiconductor dies (e.g., gate trenches, field plates, edge termination structures, etc) are provided between the chip stopping structure 144 and the preliminary kerf trench 112. The chip stopping structure 144 includes a chip stopping trench 146 that extends from the main surface 102 into the semiconductor body. The chip stopping trench 146 is separated from the rear surface 104 by semiconductor material. That is, the chip stopping trench 146 does not completely extend through the semiconductor material. In the case that the semiconductor wafer 100 includes an epitaxial layer formed on a base substrate (e.g., a bulk silicon wafer), the chip stopping trench 146 can extend partially into the epitaxial layer such that it is separated from the base substrate by a region of the epitaxial layer. The chip stopping trench 146 additionally includes dielectric material filling the chip stopping trench 146. According to an embodiment, the chip stopping trench 146 includes a dielectric layer (e.g., $SiO_2$) and an electrically conductive material (e.g., polysilicon) formed within the chip stopping trench 146. The dielectric layer and the electrically conductive material can be formed according to similar or identical techniques as the cell field trenches 122 with a conductive electrode and a dielectric material. In one embodiment, each of these structures are formed by a common processing step or steps.

The chip stopping structure 144 is configured to provide a termination point for cracks that propagate from the kerf region 108 into the die site 106 during the singulation process. In the above described singulation steps, the possibility exists that cracks can form at the corner of the preliminary kerf trenches 112. Some of these cracks can propagate away from the preliminary kerf trenches 112 and towards the main surface 102. As the chip stopping structure 144 does not contribute to the functionality of the device, these cracks can terminate at or in the material filling the chip stopping structure 144 without impacting the function of the singulated semiconductor die.

Referring to FIG. 7, two different plan view configurations for the preliminary kerf trenches 112 at the wafer level are shown. As shown in FIG. 7A, the preliminary kerf trenches 112 can be formed in a grid pattern that mirrors the pattern of the kerf regions 108 as shown in FIG. 1A. In this configuration, the preliminary kerf trenches 112 laterally extend across the semiconductor wafer 100 in two different directions and thus intersect with one another at regularly spaced apart points. These two different directions may be orthogonal to one another such that intersecting ones of the preliminary kerf trenches 112 are perpendicular to one another.

In the embodiment of FIG. 7A, the sidewalls 136 of the intersecting preliminary kerf trenches 112 form a substantially perpendicular angle at the intersections. By contrast, in the embodiment of FIG. 7B, bevelled transitions 148 are formed between the sidewalls 136 of the intersecting preliminary kerf trenches 112. The bevelled transitions 148 are provided by an angled sidewall section 150 that is angled relative to the sidewalls 136 of the intersecting ones of the preliminary kerf trenches 112. In one particular embodiment, this angled sidewall section 150 forms an angle of about 45 degrees with both sidewalls 136 of the intersecting preliminary kerf trenches 112. More generally, the angled sidewall section 150 can be angled between about 30 and 60 degrees relative to the adjoining sidewall of the respective preliminary kerf trenches 112. Moreover, instead of a planar structure as shown, the bevelled transition 148 can include a variety of geometries, including curved and/or tapered surfaces. One advantage of the bevelled transitions 148 is reduced possibility of cracking of the semiconductor wafer 100 during singulation, e.g., from mechanical sawing.

Figure 8:
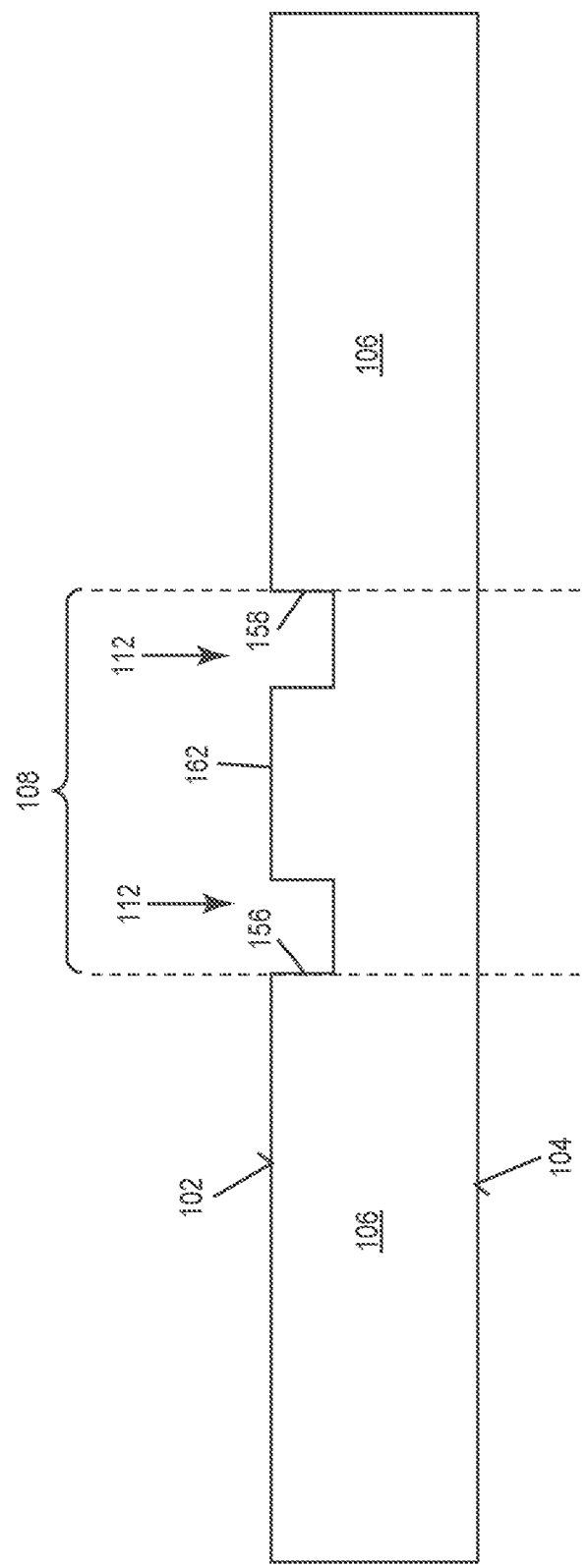
FIG. 8 depicts a method of forming preliminary kerf trenches in the kerf region of a semiconductor wafer prior to singulation, according to another embodiment.

Referring to FIG. 8, another embodiment for singulating a semiconductor wafer 100 that includes forming preliminary kerf trenches 112 prior to singulation is depicted. According to this technique, a semiconductor wafer 100 is provided. After providing the semiconductor wafer 100, first and second preliminary kerf trenches 112 are formed in the kerf region 108 between each die site 106. From a plan view perspective of the semiconductor wafer 100, the first and second preliminary kerf trenches 112 can be formed in a grid pattern as shown in FIG. 1. The first and second preliminary kerf trenches 112 can be formed according to the previously described techniques, e.g., by masked etching.

Figure 9:
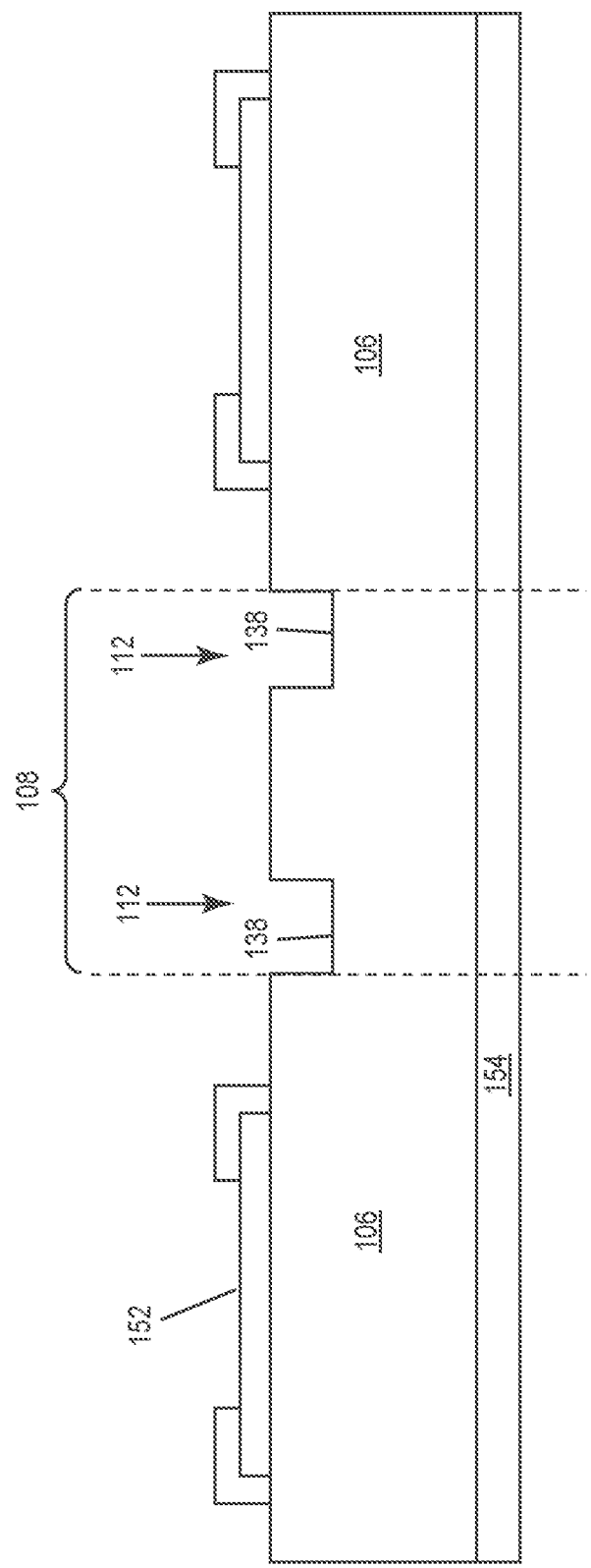
FIG. 9 depicts forming active semiconductor devices in the die sites after forming the preliminary kerf trenches, according to an embodiment.

Referring to FIG. 9, after forming the first and second preliminary kerf trenches 112, further processing steps are performed to form active semiconductor devices in the die sites 106. In one particular example, the semiconductor wafer 100 is a silicon carbide wafer and the active semiconductor devices are SiC based power devices, such as an SiC based JFET, diode, MOSFET, etc. More generally, the active semiconductor devices can have any of the previously described configurations and the semiconductor wafer 100 can include any of the previously described materials. Terminals of the active semiconductor devices can be provided by a front side metallization 152 that is provided on the main surface 102 and a rear side metallization 154 that is provided on the rear surface 104.

Figure 10:
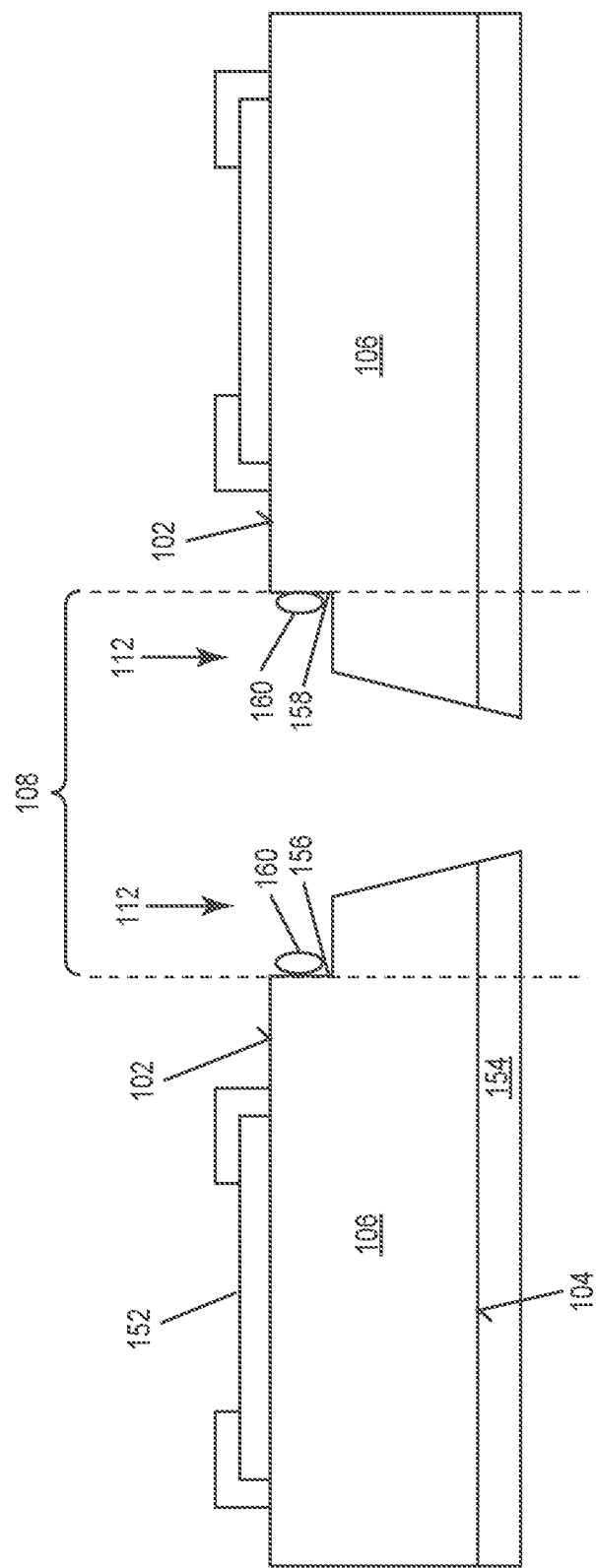
FIG. 10 depicts singulating the semiconductor wafer after forming the active semiconductor devices, according to an embodiment.

Referring to FIG. 10, after forming the preliminary kerf trenches 112 and the active semiconductor devices, a singulation process is performed. In this example, the semiconductor wafer 100 is cut at a location that is between opposing sidewalls 156 and 158 of two different trenches. Specifically, the cut is formed at a location that is between a first sidewall 156 of the first preliminary kerf trench 112 and second sidewall 158 of the second preliminary kerf trench 112. More particularly, the cut is formed at the upper surface 162 portion of the main surface 102 that extends between the first and second preliminary kerf trenches 112. As will be described in further detail below, further processing steps can be performed to lower the upper surface 162 in the kerf region 108. In any case, the cut is formed in a surface of the kerf region 108 that is parallel to the main surface 102 and is disposed between the opposing sidewalls 156 and 158 of the preliminary kerf trenches 112. As a result, an outer edge side for each of the discrete semiconductor dies is provided by the cut surface and one of the first and second sidewalls 156, 158.

According to an embodiment, the singulation process is performed using laser ablation. According to this technique, the laser is applied to the upper surface 156 of the semiconductor wafer 100 in central portions of the kerf regions 108 that are between the opposite facing sidewalls 156 and 158. During the laser ablation, the vapourized semiconductor material that is removed from the semiconductor wafer 100 can accumulate along exposed semiconductor surfaces. Advantageously, the first and second opposite facing sidewalls 156, 158 of the first and second preliminary trenches provide respective exposed semiconductor surfaces that attract this recast material 160. In an embodiment, substantially all of the recast material 160 that forms on the semiconductor wafer 100 accumulates on the sidewalls 156, 158 of the preliminary kerf trenches 112. This means that only a minimal amount (e.g., less than 5% of the recast material 160) forms on the main surface 102 of the semiconductor wafer 100. This mitigates the potential for device failure or degradation in performance in the singulated semiconductor dies.

Figure 11:
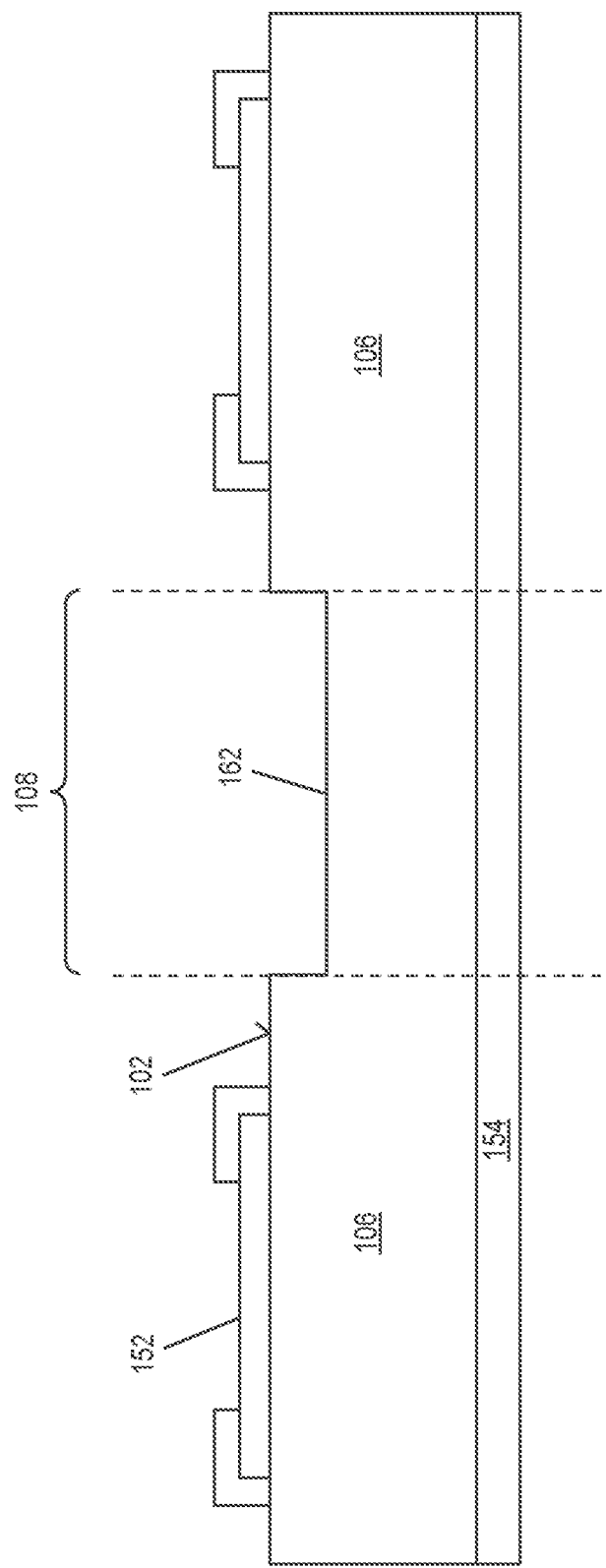
FIG. 11 depicts performing a further step of removing semiconductor material after forming the preliminary kerf trenches and prior to singulation, according to an embodiment.

Referring to FIG. 11, an alternate process sequence is shown, according to an embodiment. According to this technique, the semiconductor wafer 100 is provided and processed as described with reference to FIGS. 8 and 9. After these processing steps and before performing the singulation process, the upper surface 162 of the semiconductor wafer 100 that extends between the first and second preliminary trenches is lowered so that it is below the main surface 102 of the semiconductor wafer 100. That is, semiconductor material is removed from the portion of the kerf regions 108 between the first and second preliminary kerf trenches 112 such that this portion no longer extends to the main surface 102. In this example, the upper surface 162 is lowered to reach the bottom surfaces 138 of the first and second preliminary kerf trenches 112, thus forming a single depth trench across the kerf region 108. Alternatively, the upper surface 162 can be lowered to be above or below the first and second preliminary trenches. This process of lowering the upper surface 162 can be done using known etching techniques, for example.

Figure 12:
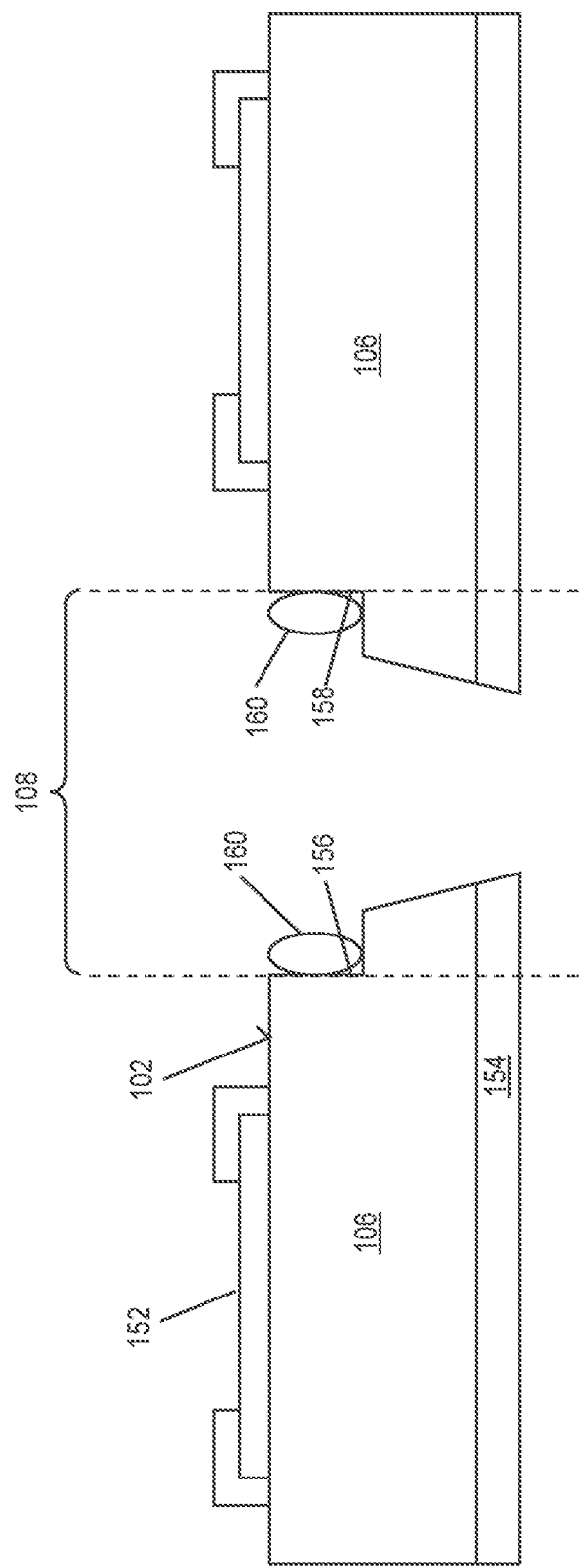
FIG. 12 depicts singulating the semiconductor wafer, according to an embodiment.

Referring to FIG. 12, after lowering the upper surface 162, the semiconductor wafer 100 is singulated using a laser ablation technique, e.g., as described above. As a result, the recast material 160 forms along the opposite facing first and second sidewalls 156, 158 in a similar manner as described above. One advantage of the technique of FIGS. 11-12 in comparison to the technique of FIGS. 8-10 is that it lowers the surface to which the laser is applied, i.e., the upper surface 162. This reduces the likelihood of recast material 160 reaching the main surface 102 of the semiconductor wafer 100 outside of the kerf region 108.

An embodiment of method of forming a semiconductor device is disclosed. The method includes providing a semiconductor wafer comprising a main surface and a rear surface opposite from the main surface, performing a die singulation preparation step in kerf regions of the semiconductor wafer, the kerf regions enclosing a plurality of die sites, the die singulation preparation step comprising forming one or more preliminary kerf trenches between at least two immediately adjacent die sites in the plurality, forming active semiconductor devices in the die sites; and singulating the semiconductor wafer in the kerf regions thereby providing a plurality of discrete semiconductor dies from the die sites, wherein the one or more preliminary kerf trenches are unfilled during the singulating, and wherein the singulating comprises removing semiconductor material from a surface of the semiconductor wafer that is between opposite facing sidewalls of the one or more preliminary kerf trenches.

In an embodiment of the method that can be combined with others, one of the opposite facing sidewalls provides an outer chip edge side for each of the discrete semiconductor dies.

In an embodiment of the method that can be combined with others, forming the active semiconductor devices comprises forming a trenched electrode structure in cell field trenches in the die sites, and the cell field trenches and the one or more preliminary kerf trenches are formed simultaneously by a common etching step.

In an embodiment of the method that can be combined with others, the one or more preliminary kerf trenches are formed to be wider and deeper than the cell field trenches.

In an embodiment of the method that can be combined with others, after performing the common etching step, a dielectric layer is formed along sidewalls of the cell field trenches and the one or more preliminary kerf trenches by a common deposition step, and the dielectric layer is present on the sidewalls of the one or more preliminary kerf trenches during the singulating of the semiconductor wafer.

In an embodiment of the method that can be combined with others, the die singulation preparation step comprises forming a single preliminary kerf trench between at least two of the die sites, and the singulating comprises forming a cut in the semiconductor wafer between a bottom of the single preliminary kerf trench and the rear surface.

In an embodiment of the method that can be combined with others, after forming the single preliminary kerf trench, one or more further trenches are formed in a bottom surface of the single preliminary kerf trench, the one or more further trenches being narrower than the single preliminary kerf trench, and the cut is formed at a location that is outside of the one or more further trenches.

In an embodiment of the method that can be combined with others, after forming the single preliminary kerf trench, forming further trench is formed in a bottom surface of the single preliminary kerf trench, and the cut is formed within the further trench.

In an embodiment of the method that can be combined with others, a chip stopping structure is formed immediately adjacent to a sidewall of one of the preliminary kerf trenches, and the chip stopping structure comprises a chip stopping trench that extends from the main surface and is separated from the rear surface by semiconductor material, and dielectric material filling the chip stopping trench.

In an embodiment of the method that can be combined with others, forming the one or more preliminary kerf trenches comprises forming two intersecting ones of the preliminary kerf trenches with bevelled transitions between sidewalls of the two intersecting ones of the preliminary kerf trenches.

In an embodiment of the method that can be combined with others, forming the one or more preliminary kerf trenches comprises forming first and second preliminary kerf trenches between each one of the die sites, an outer sidewall of the first preliminary trench and an outer sidewall of the second preliminary trench provide the opposite facing sidewalls, and the opposite facing sidewalls are exposed semiconductor surfaces during the singulating.

In an embodiment of the method that can be combined with others, the singulating comprises performing laser ablation to an upper surface of the semiconductor wafer in central portions of the kerf regions that are between the opposite facing sidewalls, performing the laser ablation causes recast material to form substantially along the opposite facing sidewalls, and the main surface of the semiconductor wafer in the die sites is substantially devoid of the recast material after performing the laser ablation.

In an embodiment of the method that can be combined with others, the semiconductor wafer comprises silicon carbide.

In an embodiment of the method that can be combined with others, before performing the laser ablation, the upper surface of the semiconductor wafer is lowered in the central portions to be below the main surface of the semiconductor wafer.

A method of forming a semiconductor device is disclosed. The method comprises providing a semiconductor wafer comprising a main surface and a rear surface opposite from the main surface, forming cell field trenches and preliminary kerf trenches in the main surface of the semiconductor wafer by a common etching step, the preliminary kerf trenches being formed in a grid pattern that encloses a plurality of die sites, the cell field trenches being formed within the die sites, singulating the plurality of die sites from the semiconductor wafer into a plurality of discrete semiconductor dies, wherein the singulating comprises forming a cut between bottom surfaces of the preliminary kerf trenches and the rear surface.

In an embodiment of the method that can be combined with others, after performing the common etching step, a dielectric layer is formed along sidewalls of the cell field trenches and the preliminary kerf trenches by a common deposition step, and the dielectric layer is present on the sidewalls of the preliminary kerf trenches during the singulating of the semiconductor wafer.

In an embodiment of the method that can be combined with others, the preliminary kerf trenches are formed to be wider and deeper than the cell field trenches.

A method of forming a semiconductor device is disclosed, the method includes providing a silicon carbide containing wafer comprising a main surface and a rear surface opposite from the main surface, forming a grid pattern of preliminary kerf trenches in the main surface of the silicon carbide containing wafer, the grid pattern enclosing a plurality of die sites, performing laser ablation on an upper surface of the silicon carbide containing wafer that is between opposite facing sidewalls of the preliminary kerf trenches, wherein performing the laser ablation causes recast material to form substantially along the opposite facing sidewalls, and wherein the main surface of the semiconductor wafer in the die sites is substantially devoid of the recast material after performing the laser ablation.

In an embodiment of the method that can be combined with others, the laser ablation singulates the semiconductor wafer thereby providing a plurality of discrete semiconductor dies from the die sites, and one of the opposite facing sidewalls provides an outer chip edge side for each of the discrete semiconductor dies.

In an embodiment of the method that can be combined with others, forming the grid pattern of preliminary kerf trenches comprises forming first and second preliminary kerf trenches between each of the die sides, the first and second preliminary kerf trenches being separated from one another by a central kerf portion of the semiconductor wafer that extends to the main surface, and the method further comprises removing semiconductor material from the central kerf portion so as to lower an upper surface of the silicon carbide containing wafer between the first and second one or preliminary kerf trenches, and wherein the laser ablation is performed on the lowered surface.

The term "substantially" encompasses absolute conformity with a requirement as well as minor deviation from absolute conformity with the requirement due to manufacturing process variations, assembly, and other factors that may cause a deviation from the desired parameter. Provided that the deviation is within process tolerances so as to achieve practical conformity and the components described herein are able to function according to the application requirements, the term "substantially" encompasses any of these deviations.

Spatially relative terms such as "under," "below," "lower," "over," "upper," and the like, are used for ease of description to explain the positioning of one element relative to a second element. These terms are intended to encompass different orientations of the package in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," and the like are open-ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, the method comprising:
   providing a semiconductor wafer comprising a main surface and a rear surface opposite from the main surface;
   performing a die singulation preparation step in kerf regions of the semiconductor wafer, the kerf regions enclosing a plurality of die sites, the die singulation preparation step comprising forming one or more preliminary kerf trenches between at least two immediately adjacent die sites in the plurality;
   forming active semiconductor devices in the die sites; and
   singulating the semiconductor wafer in the kerf regions thereby providing a plurality of discrete semiconductor dies from the die sites,
   wherein the one or more preliminary kerf trenches are unfilled during the singulating, and
   wherein the singulating comprises removing semiconductor material from a surface of the semiconductor wafer that is between opposite facing sidewalls of the one or more preliminary kerf trenches,
   wherein forming the active semiconductor devices comprises forming a trenched electrode structure in cell field trenches in the die sites, and wherein the cell field trenches and the one or more preliminary kerf trenches are formed simultaneously by a common etching step.

2. The method of claim 1, wherein one of the opposite facing sidewalls provides an outer chip edge side for each of the discrete semiconductor dies.

3. The method of claim 2, wherein forming the one or more preliminary kerf trenches comprises forming first and second preliminary kerf trenches between two immediately adjacent die sites, wherein an outer sidewall of the first preliminary trench and an outer sidewall of the second preliminary trench provide the opposite facing sidewalls, and wherein the opposite facing sidewalls are exposed semiconductor surfaces during the singulating.

4. The method of claim 3, wherein the singulating comprises performing laser ablation to an upper surface of the semiconductor wafer in central portions of the kerf regions that are between the opposite facing sidewalls, wherein performing the laser ablation causes recast material to form substantially along the opposite facing sidewalls, and wherein the main surface of the semiconductor wafer in the die sites is substantially devoid of the recast material after performing the laser ablation.

5. The method of claim 4, wherein the semiconductor wafer comprises silicon carbide.

6. The method of claim 4, further comprising, before performing the laser ablation, lowering the upper surface of the semiconductor wafer in the central portions to be below the main surface of the semiconductor wafer.

7. The method of claim 1, wherein the one or more preliminary kerf trenches are formed to be deeper than the cell field trenches.

8. The method of claim 1, further comprising, after performing the common etching step, forming a dielectric layer along sidewalls of the cell field trenches and the one or more preliminary kerf trenches by a common deposition step, and wherein the dielectric layer is present on the sidewalls of the one or more preliminary kerf trenches during the singulating of the semiconductor wafer.

9. The method of claim 1, wherein the die singulation preparation step comprises forming a single preliminary kerf trench between two immediately adjacent die sites, and wherein the singulating comprises forming a cut in the semiconductor wafer between a bottom of the single preliminary kerf trench and the rear surface.

10. The method of claim 9, further comprising, after forming the single preliminary kerf trench, forming one or more further trenches in a bottom surface of the single preliminary kerf trench, the one or more further trenches being narrower than the single preliminary kerf trench, and wherein the cut is formed at a location that is outside of the one or more further trenches.

11. The method of claim 9, further comprising, after forming the single preliminary kerf trench, forming a further trench in a bottom surface of the single preliminary kerf trench, and wherein the cut is formed within the further trench.

12. The method of claim 1, further comprising forming a chip stopping structure immediately adjacent to a sidewall of one of the preliminary kerf trenches, and wherein the chip stopping structure comprises:
   a chip stopping trench that extends from the main surface and is separated from the rear surface by semiconductor material; and
   dielectric material filling the chip stopping trench.

13. The method of claim 1, wherein forming the one or more preliminary kerf trenches comprises forming two intersecting ones of the preliminary kerf trenches with bevelled transitions between sidewalls of the two intersecting ones of the preliminary kerf trenches.

14. A method of forming a semiconductor device, the method comprising:
   providing a semiconductor wafer comprising a main surface and a rear surface opposite from the main surface;
   forming cell field trenches and preliminary kerf trenches in the main surface of the semiconductor wafer by a common etching step, the preliminary kerf trenches being formed in a grid pattern that encloses a plurality of die sites, the cell field trenches being formed within the die sites;
   singulating the plurality of die sites from the semiconductor wafer into a plurality of discrete semiconductor dies,
   wherein the singulating comprises forming a cut between bottom surfaces of the preliminary kerf trenches and the rear surface.

15. The method of claim 14, further comprising, after performing the common etching step, forming a dielectric layer along sidewalls of the cell field trenches and the preliminary kerf trenches by a common deposition step, and wherein the dielectric layer is present on the sidewalls of the preliminary kerf trenches during the singulating of the semiconductor wafer.

16. The method of claim 14, wherein the preliminary kerf trenches are formed to be deeper than the cell field trenches.

17. A method of forming a semiconductor device, the method comprising:
   providing a silicon carbide containing wafer comprising a main surface and a rear surface opposite from the main surface;
   forming a grid pattern of preliminary kerf trenches in the main surface of the silicon carbide containing wafer, the grid pattern enclosing a plurality of die sites;
   performing laser ablation on an upper surface of the silicon carbide containing wafer that is between opposite facing sidewalls of the preliminary kerf trenches,
   wherein performing the laser ablation causes recast material to form substantially along the opposite facing sidewalls, and
   wherein the main surface of the semiconductor wafer in the die sites is substantially devoid of the recast material after performing the laser ablation,
   wherein forming the grid pattern of preliminary kerf trenches comprises forming first and second preliminary kerf trenches between each of the die sides, the first and second preliminary kerf trenches being separated from one another by a central kerf portion of the semiconductor wafer that extends to the main surface.

18. The method of claim 17, wherein the laser ablation singulates the semiconductor wafer thereby providing a plurality of discrete semiconductor dies from the die sites, and wherein one of the opposite facing sidewalls provides an outer chip edge side for each of the discrete semiconductor dies.

19. The method of claim 17, further comprising removing semiconductor material from the central kerf portion so as to lower an upper surface of the silicon carbide containing wafer between the first and second one or preliminary kerf trenches, and wherein the laser ablation is performed on the lowered surface.

20. A method of forming a semiconductor device, the method comprising:
   providing a semiconductor wafer comprising a main surface and a rear surface opposite from the main surface;
   performing a die singulation preparation step in kerf regions of the semiconductor wafer, the kerf regions enclosing a plurality of die sites, the die singulation preparation step comprising forming one or more preliminary kerf trenches between at least two immediately adjacent die sites in the plurality;
   forming active semiconductor devices in the die sites; and
   singulating the semiconductor wafer in the kerf regions thereby providing a plurality of discrete semiconductor dies from the die sites,
   wherein the one or more preliminary kerf trenches are unfilled during the singulating, and
   wherein the singulating comprises removing semiconductor material from a surface of the semiconductor wafer that is between opposite facing sidewalls of the one or more preliminary kerf trenches,
   wherein one of the opposite facing sidewalls provides an outer chip edge side for each of the discrete semiconductor dies,
   wherein forming the one or more preliminary kerf trenches comprises forming first and second preliminary kerf trenches between two immediately adjacent die sites, wherein an outer sidewall of the first preliminary trench and an outer sidewall of the second preliminary trench provide the opposite facing sidewalls, and wherein the opposite facing sidewalls are exposed semiconductor surfaces during the singulating.

21. The method of claim 20, wherein the singulating comprises performing laser ablation to an upper surface of the semiconductor wafer in central portions of the kerf regions that are between the opposite facing sidewalls, wherein performing the laser ablation causes recast material to form substantially along the opposite facing sidewalls, and wherein the main surface of the semiconductor wafer in the die sites is substantially devoid of the recast material after performing the laser ablation.

22. The method of claim 21, wherein the semiconductor wafer comprises silicon carbide.

23. The method of claim 21, further comprising, before performing the laser ablation, lowering the upper surface of the semiconductor wafer in the central portions to be below the main surface of the semiconductor wafer.

* * * * *